United States Patent [19]
Kalnitsky et al.

[11] Patent Number: 6,146,962
[45] Date of Patent: Nov. 14, 2000

[54] METHOD FOR FORMING A DRAM CELL WITH A STACKED CAPACITOR

[75] Inventors: Alexander Kalnitsky, San Francisco; Albert Bergemont, Palo Alto, both of Calif.

[73] Assignee: National Semiconductor Corporation, Santa Clara, Calif.

[21] Appl. No.: 09/040,212

[22] Filed: Mar. 17, 1998

[51] Int. Cl.[7] .................................................. H01L 21/20
[52] U.S. Cl. ........................ 438/396; 438/397; 438/398; 438/399; 438/253
[58] Field of Search .................................... 438/238, 239, 438/253, 254, 396, 397, 398, 399

[56] References Cited

U.S. PATENT DOCUMENTS

| 5,128,273 | 7/1992 | Ema | 437/52 |
|---|---|---|---|
| 5,409,856 | 4/1995 | Jun | 437/52 |
| 5,631,184 | 5/1997 | Ikemasu et al. | 438/397 |
| 5,637,523 | 6/1997 | Fazan et al. | 438/397 |
| 5,672,534 | 9/1997 | Huang | 437/52 |
| 5,891,772 | 4/1999 | Hsu | 438/254 |
| 5,930,626 | 7/1999 | Park | 438/254 |
| 5,989,955 | 11/1999 | Hsu | 438/253 |

*Primary Examiner*—Matthew Smith
*Assistant Examiner*—V. Yevsikov
*Attorney, Agent, or Firm*—Limbach & Limbach L.L.P.

[57] ABSTRACT

A dynamic random-access-memory (DRAM) cell with a fin or wing-type stacked capacitor is fabricated by using a layer of polysilicon as an etch stop rather than the layer of nitride that is conventionally used. By using the layer of polysilicon, the problem of hydrogen-enhanced boron diffusion in dual work function CMOS transistors is eliminated while at the same time increasing the capacitance of the stacked capacitor without substantially increasing the step height of the capacitor.

16 Claims, 9 Drawing Sheets

METHOD FOR FORMING A DRAM CELL WITH A STACKED CAPACITOR

BACKGROUND OF THE INVENTION

1. Field of the Invention

The present invention relates to a method for forming a DRAM cell and, more particularly, to a method for forming a DRAM cell with a stacked capacitor.

2. Description of the Related Art

A dynamic random-access-memory (DRAM) cell is a semiconductor memory device that only temporarily stores information and, therefore, must be periodically refreshed to insure that the information stored in the cell is properly retained.

FIG. 1 shows a cross-sectional view that illustrates a conventional DRAM cell 10. As shown in FIG. 1, DRAM cell 10 includes an access transistor 12 which has spaced-apart n+ source and drain regions 14 and 16 which are formed in a p-type semiconductor substrate 18.

In addition, transistor 12 also includes a channel region 20 which is defined in substrate 18 between the source and drain regions 14 and 16, a layer of gate oxide 22 formed above channel region 20, and a gate 24 which is formed over oxide layer 20.

As further shown in FIG. 1, cell 10 also includes a capacitor 30 which has a lower plate 32 that is formed to contact drain region 16, and an upper plate 34 which is insulatively formed over lower plate 32. In addition, transistor 12 is insulated from surrounding structures, including capacitor 30, by a layer of insulation material 36.

In operation, cell 10 is programmed by applying a first programming voltage to gate 24, and a second programming voltage to source region 14. In addition, a capacitor voltage is continuously applied to upper plate 34.

In response to these biasing conditions, channel region 20 inverts which allows majority carriers (electrons) from drain region 16 to flow to source region 14. As a result of the loss of electrons from drain region 16, the potential on drain region 16 is increased.

Cell 10 is erased by reversing the process and applying an erase voltage to gate 24, and ground to source region 14. In this case, channel region 20 is again inverted, but the higher potential on drain region 16 causes the electrons to flow from source region 14 to drain region 16.

Cell 10 is read by applying a read voltage to gate 24, and connecting source region 14 to a sense amplifier (not shown). In response to these biasing conditions, the potential on drain region 16 appears on source region 14, less the threshold voltage of access transistor 12, which is then detected by the sense amplifier.

One problem with conventional DRAM cells is that as the area consumed by a cell is reduced in size, the area available to the capacitor is also reduced in size which, in turn, limits the ability of the cell to maintain a programmed state. One solution to this problem has been to vertically increase the size of the capacitor by using a stacked capacitor.

FIG. 2 shows a cross-sectional view that illustrates a conventional stacked-capacitor DRAM cell 50. As shown in FIG. 2, DRAM cell 50 is similar to cell 10 and, as a result, utilizes the same reference numerals to identify the structures which are common to both cells.

DRAM cell 50 principally differs from cell 10 in that cell 50 utilizes a stacked capacitor 52 which has a lower plate 54 that is formed to have a series of fins or wings 56, and an upper plate 60 which is insulatively formed over lower plate 54. In addition, cell 50 also utilizes a layer of nitride 62 which is formed over the portion of insulation layer 36 that supports capacitor 52.

By utilizing stacked capacitor 52, the size of the capacitor can be significantly increased without consuming any additional cell area. As a result, the dimensions of cell 50 can be reduced without reducing the capacitance provided by the cell.

FIGS. 3A–3H shows cross-sectional views that illustrate the fabrication of DRAM cell 50. As shown in FIG. 3A, conventional steps are used to fabricate transistor 12 and the overlying layer of insulation material 36.

Once the conventional steps have been completed, nitride layer 62 is deposited over insulation layer 36. After this, a layer of sacrificial oxide 64 is formed over nitride layer 62, followed by the deposition of an overlying layer of polysilicon (poly) 66. Next, a second layer of sacrificial oxide 70 is formed over poly layer 66, followed by the formation and patterning of a contact mask 72 over oxide layer 70.

After this, as shown in FIG. 3B, oxide layer 70, poly layer 66, oxide layer 64, nitride layer 62, and insulation layer 36 are anisotropically etched to form a contact opening 74 that exposes a contact area 76 on the surface of drain region 16. Once contact opening 74 has been formed, mask 72 is removed.

Next, as shown in FIG. 3C, a layer of poly 80 is deposited over oxide layer 70, the sidewalls of contact opening 74, and contact area 76. Following this, a lower plate mask 82 is formed and patterned over poly layer 80.

Once mask 82 has been formed, as shown in FIG. 3D, poly layer 80, oxide layer 70, poly layer 66, and a portion of oxide layer 64 are anisotropically etched to define the size of lower plate 54. After this, mask 82 is removed.

Once mask 82 has been removed, as shown in FIG. 3E, the resulting structure is isotropically etched to remove the remainder of oxide layer 64 and oxide layer 70. During this etching step, nitride layer 62 is used as an etch stop to protect the underlying layer of insulation material 36. (Mask 82 may alternately be removed following the isotropic etch step).

Turning now to FIG. 3F, after the isotropic etch step has been completed, a thin layer of dielectric 84 is formed on the exposed surfaces of poly layers 66 and 80. Following this, a layer of poly 86 is then deposited over nitride layer 62 and dielectric layer 84. Next, an upper electrode mask 90 is formed and patterned over poly layer 86.

Once mask 90 has been formed, as shown in FIG. 3G, the unmasked layer of poly 86 is etched to form upper plate 60. Conventional back end processing steps are then followed to complete the fabrication of the cell.

As noted above, conventional steps are utilized to form access transistor 12. In addition to forming access transistor 12, the same process steps are also utilized to fabricate the CMOS transistors that form the peripheral circuitry, e.g., the row and column decoders, that support an array of DRAM cells.

Conventionally, the gates of the peripheral CMOS transistors are all doped to have the same type of conductivity. More recently, however, the peripheral CMOS transistors are formed to have dual-work function gates where the gates of the NMOS transistors are implanted with an n-type material, such as phosphorous, and the gates of the PMOS transistors are implanted with a p-type material, such as boron.

One problem with the above-described fabrication process is that, during the formation of nitride layer 62, hydrogen is trapped below nitride layer 62. The hydrogen migrates down during the subsequent fabrication steps and enhances the diffusion of boron from the gates to the underlying layer of gate oxide which, in turn, undesirably alters the threshold voltages of the PMOS transistors.

One technique for reducing this hydrogen-enhanced boron diffusion is to remove the exposed portion of nitride layer 62 during the etching step that is used to form the upper plate 60 of capacitor 52 as shown in FIG. 3H.

Although removing the exposed portion of nitride layer 62 reduces the problem, there is a need for other techniques that further reduce or eliminate the problem of hydrogen-enhanced boron diffusion.

SUMMARY OF THE INVENTION

Conventionally, dynamic random-access-memory (DRAM) cells with a fin or wing-type stacked capacitor are fabricated using a nitride layer as an etch stop. The nitride layer traps hydrogen which causes hydrogen-enhanced boron diffusion in dual work function CMOS transistors that are formed in the periphery of an array of DRAM cells. The method of the present invention eliminates this hydrogen-enhanced boron diffusion by using a layer of polysilicon as the etch stop rather than the layer of nitride.

The method of the present invention begins with the conventional formation of an access transistor in a substrate of a first conductivity type. The access transistor includes spaced-apart source and drain regions of a second conductivity type which are formed in the substrate, and a channel region which is defined in the substrate between the source and drain regions.

Further, the access transistor also includes a layer of gate oxide which is formed above the channel region, and a gate which is formed on the layer of gate oxide from a first layer of polysilicon (poly-1). In addition to the access transistor, a layer of insulation material is also conventionally formed over the access transistor.

In accordance with the present invention, the method begins with the step of forming a second layer of polysilicon (poly-2) on the layer of insulation material. After this, a first layer of sacrificial material is formed on the layer of poly-2. Next, a third layer of polysilicon (poly-3) is formed on the first layer of sacrificial material, followed by the formation of a second layer of sacrificial material on the layer of poly-3.

After the layer of poly-3 has been formed, the second layer of sacrificial material, the layer of poly-3, the first layer of sacrificial material, the layer of poly-2, and the layer of insulation material are selectively etched to form a contact opening having sidewalls that exposes a contact area on the surface of the drain region.

Following this, a fourth layer of polysilicon (poly-4) is formed on the second layer of sacrificial material, the sidewalls of the contact opening, and the contact area.

A better understanding of the features and advantages of the present invention will be obtained by reference to the following detailed description and accompanying drawings which set forth an illustrative embodiment in which the principals of the invention are utilized.

DETAILED DESCRIPTION

FIGS. 4A–4H show cross-sectional views that illustrate a method for forming a DRAM cell in accordance with the present invention. As described in greater detail below, the present invention eliminates the problem of hydrogen-enhanced boron diffusion by utilizing a layer of polysilicon in lieu of the layer of nitride to form the stacked capacitor of the cell.

Figure 4A:
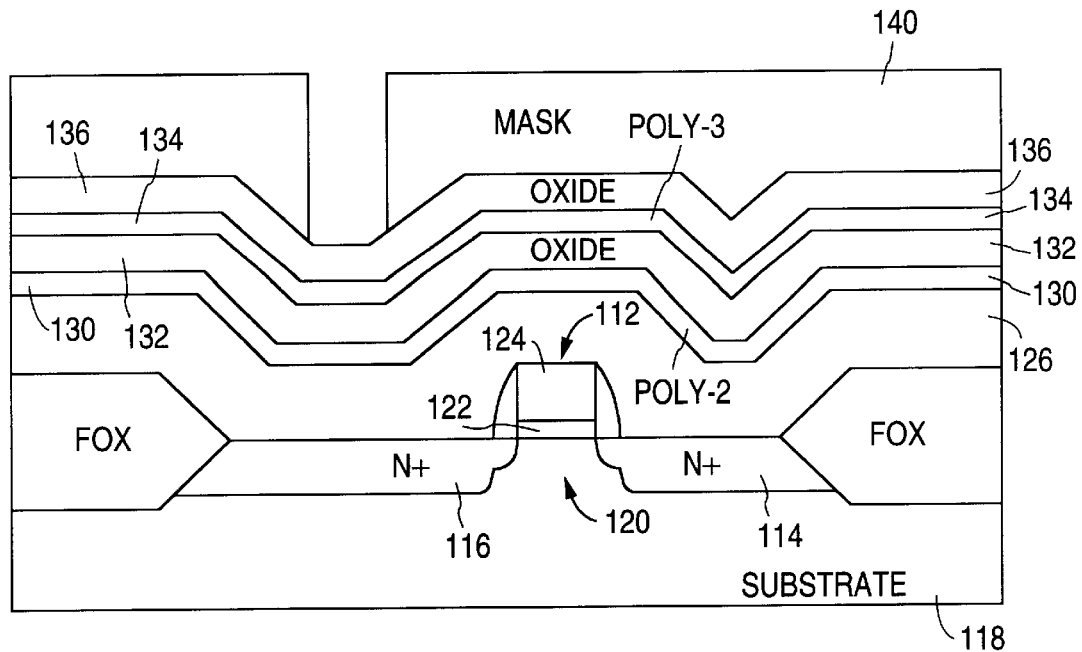
FIGS. 4A–4H are cross-sectional views illustrating a method for forming a DRAM cell in accordance with the present invention.

As shown in FIG. 4A, conventional steps are used to fabricate an access transistor 112 which has spaced-apart n+ source and drain regions 114 and 116 that are formed in a p-type semiconductor substrate 118. (Source and drain regions 114 and 116 may optionally be formed to have an overlying layer of silicide as is routinely done in CMOS logic processes with dual-work function gates).

In addition, transistor 112 also has a channel region 120 which is defined in substrate 118 between the source and drain regions 114 and 116, a layer of gate oxide 122 which is formed above channel region 120, and a gate 124 which is formed over gate oxide layer 122 from a first layer of polysilicon (poly-1).

Further, conventional steps are also utilized to form regions of field oxide FOX or other types of isolation which are used to isolate adjacent DRAM cells, and to form a layer of non-doped insulation material 126, such as TEOS, over transistor 112 and the field oxide regions FOX.

Following these conventional steps, a second layer of polysilicon (poly-2) 130 approximately 200 Å thick is deposited on insulation layer 126, and then in-situ doped to have an n-type conductivity. After this, a first layer of sacrificial material 132 approximately 1000 Å thick is formed over poly-2 layer 130. The first layer of sacrificial material 132 may be implemented with any material which is etchable by an etchant that is highly selective to polysilicon, such as oxide.

Once sacrificial (oxide) layer 132 has been formed, a third layer of polysilicon (poly-3) 134 approximately 300 Å–1500 Å thick is deposited on oxide layer 132, and then in-situ doped to have an n-type conductivity. Next, a second layer of sacrificial material 136 approximately 1000 Å thick is formed over poly-3 layer 134, followed by the formation and patterning of a contact mask 140 over sacrificial layer 136. (Additional layers of poly and an overlying layer of sacrificial oxide can be used to increase the height and capacitance of the to-be-formed capacitor as required).

As with the first layer of sacrificial material 132, the second layer of sacrificial material 136 may be implemented with any material which is etchable by an etchant that is highly selective to polysilicon, such as oxide.

Figure 4B:
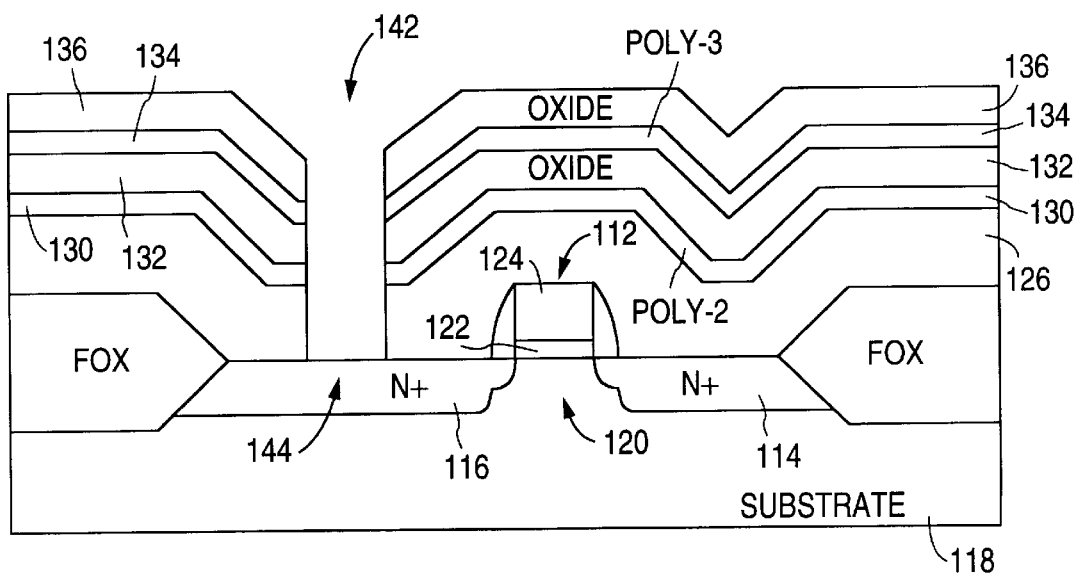

After this, as shown in FIG. 4B, sacrificial (oxide) layer 136, poly-3 layer 134, oxide layer 132, poly-2 layer 130, and insulation layer 126 are anisotropically etched to form a contact opening 142 that exposes a contact area 144 on the surface of drain region 116. Once contact opening 142 has been formed, mask 140 is removed.

Figure 4C:
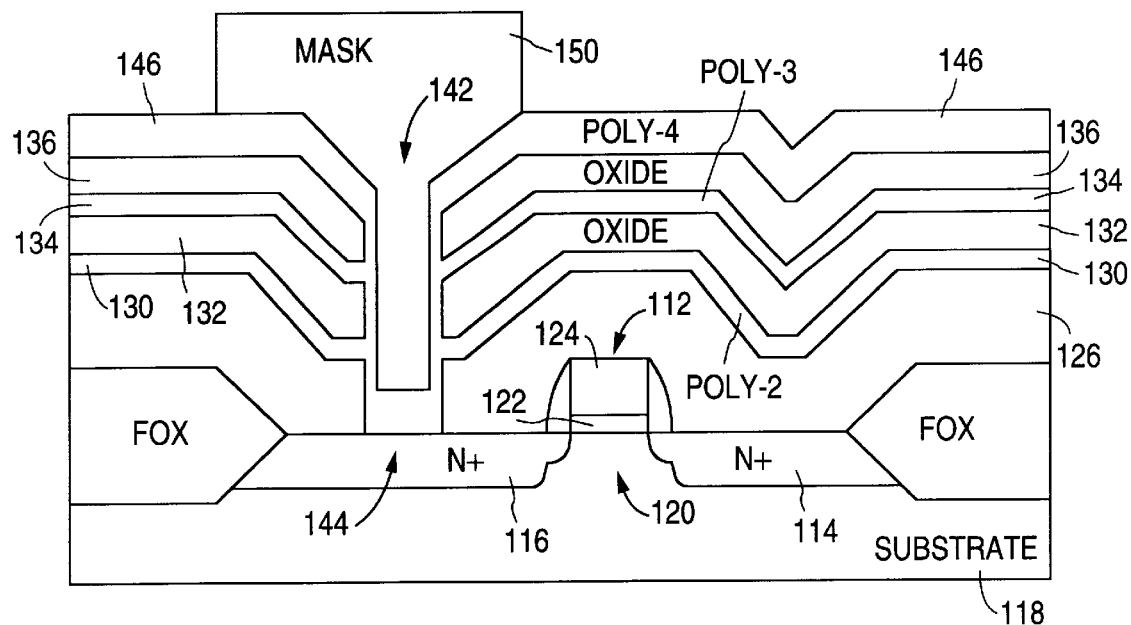

Next, as shown in FIG. 4C, a fourth layer of polysilicon (poly-4) 146 is deposited over oxide layer 136, the sidewalls of contact opening 142, and the contact area 144, and then doped to have an n-type conductivity. After poly-4 layer 146 has been deposited, a lower plate mask 150 is formed and patterned over poly-4 layer 146.

Figure 4D:
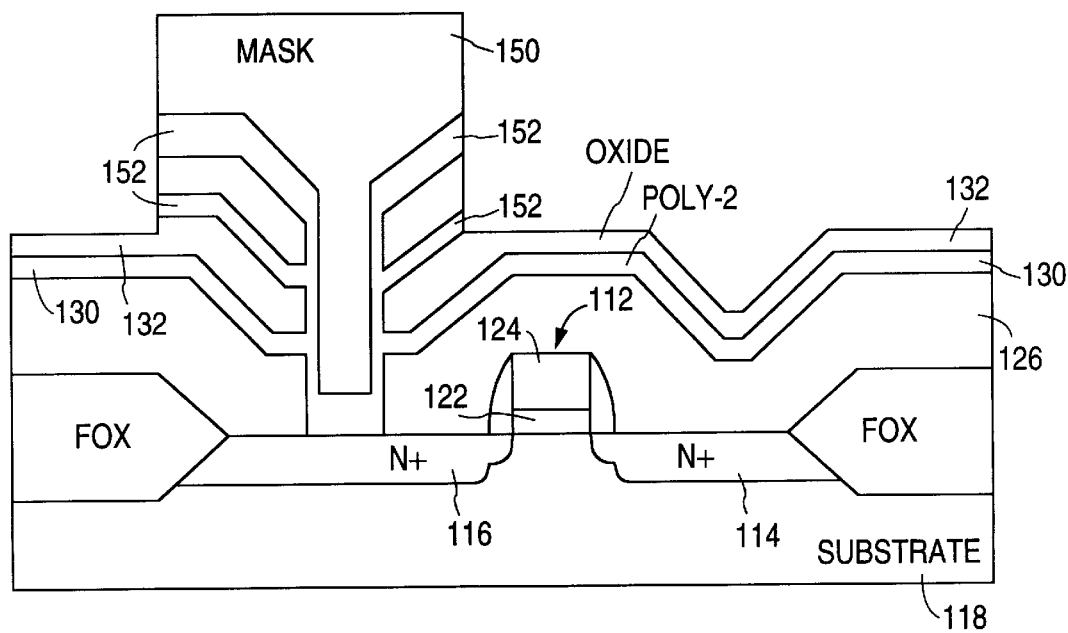
Figure 4E:
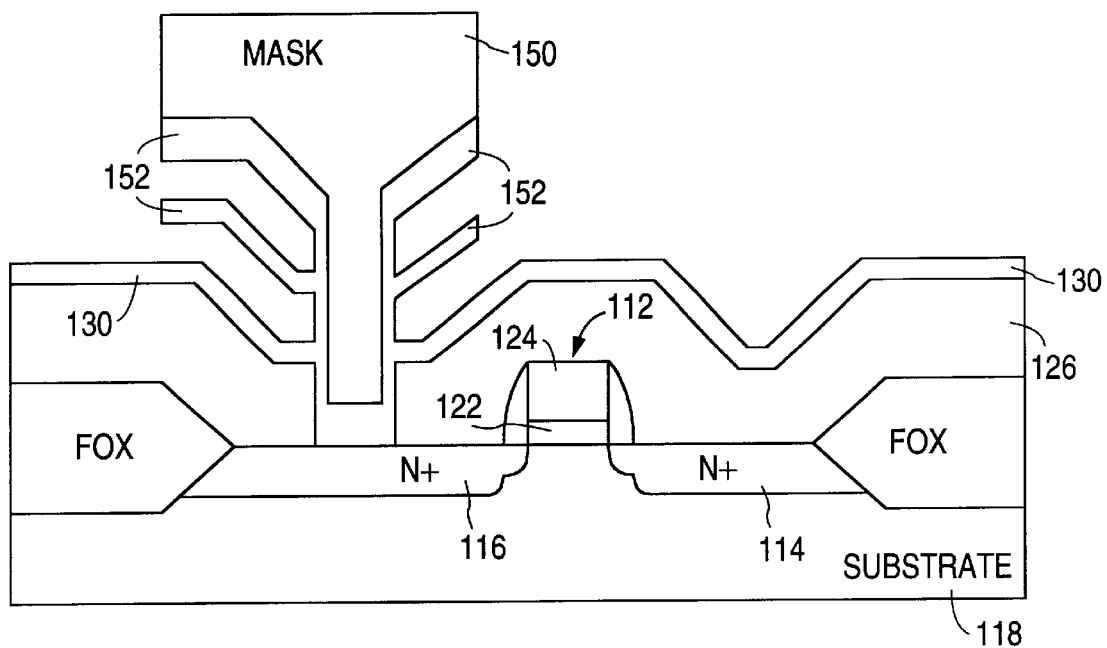

Following this, as shown in FIG. 4D, poly-4 layer 146, oxide layer 136, poly-3 layer 134, and a portion of oxide layer 132 are anisotropically etched to partially define the size of a lower capacitor plate 152. After this, as shown in FIG. 4E, the resulting structure is isotropically etched with, for example, hydrofluoric acid, to remove the remainder of oxide layers 132 and 136.

Figure 4F:
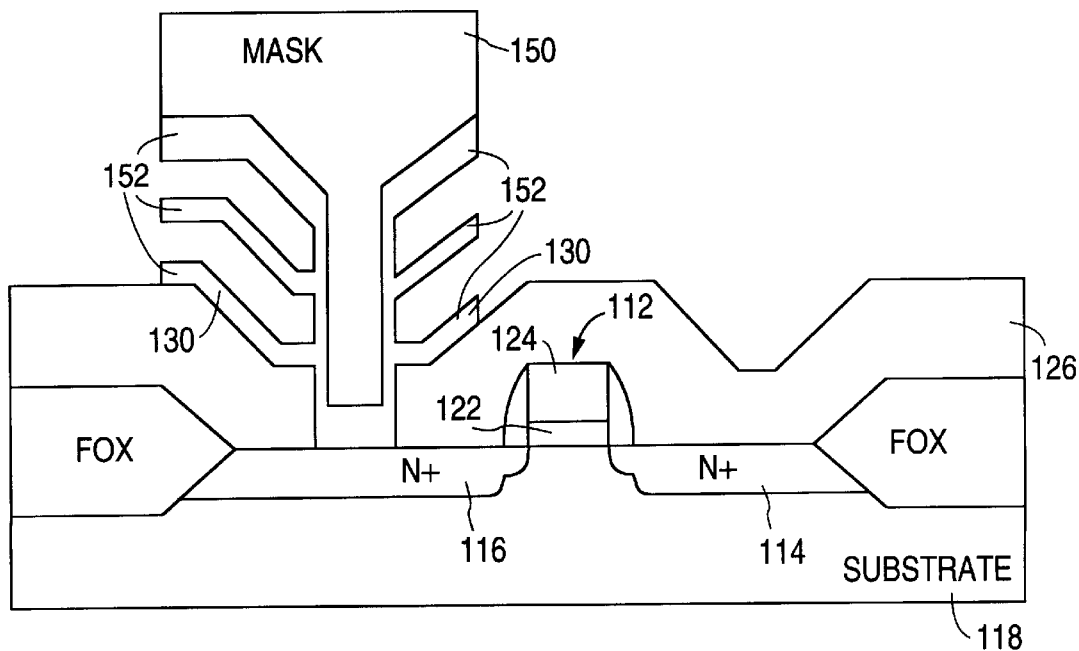

As shown in FIG. 4F, once oxide layers 132 and 136 have been removed, poly-2 layer 130 is then anisotropically etched to remove the portions of poly-2 layer 130 which are not covered by mask 150. After this, mask 150 is removed.

Rather than performing the isotropic etch of oxide layers 132 and 136, and the anisotropic etch of poly-2 layer 130 with mask 150 in place, mask 150 may alternately be removed prior to the isotropic etch. By removing mask 150 prior to the isotropic etch, the top surface of poly-4 layer 146 is also exposed to the silicon consuming, and thus roughening layer 130, etch.

When mask 150 is removed prior to the isotropic etch, poly-4 layer 146 is used as a mask for the subsequent anisotropic etch of poly-2 layer 130. In this case, however, poly-4 layer 146 must be formed to be approximately 200 Å–400 Å thicker to compensate for the loss of poly-4 layer 146 that will occur during the anisotropic etch of poly-2 layer 130.

Figure 4G:
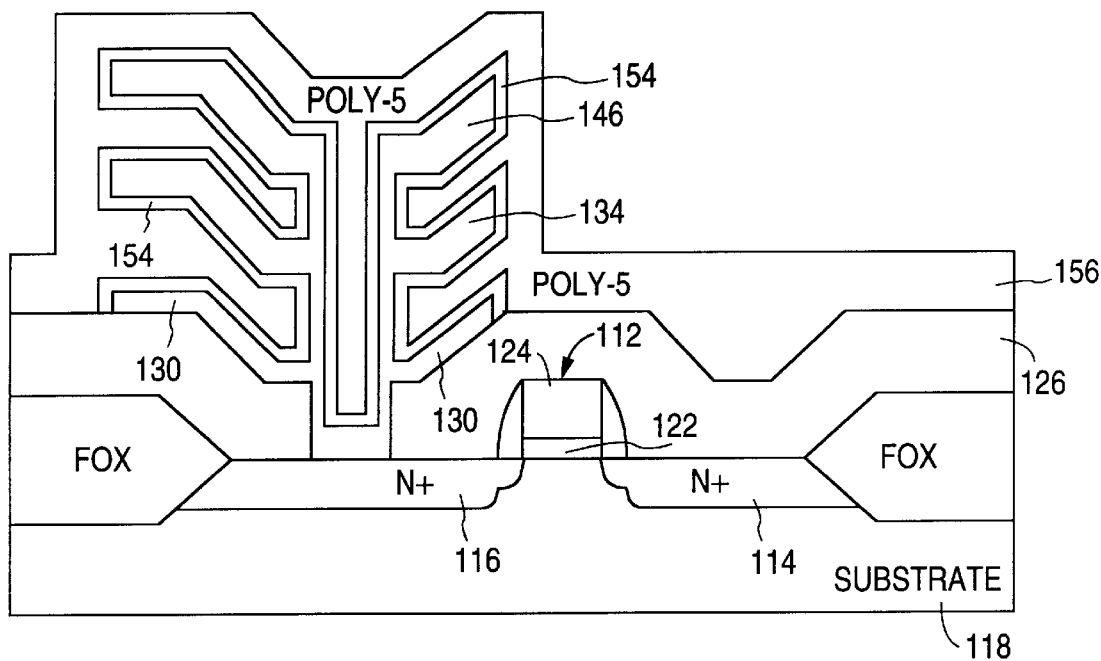

Turning to FIG. 4G, once poly-2 layer 130 has been etched, a thin layer of dielectric 154 approximately 25 Å–60 Å thick is formed on the exposed surfaces of poly-2 layer 130, poly-3 layer 134, and poly-4 layer 146 via thermal oxidation or chemical vapor deposition (CVD). Following this, a fifth layer of polysilicon (poly-5) 156 is deposited over insulation layer 126 and dielectric layer 154, and then doped to have an n-type conductivity.

Figure 4H:
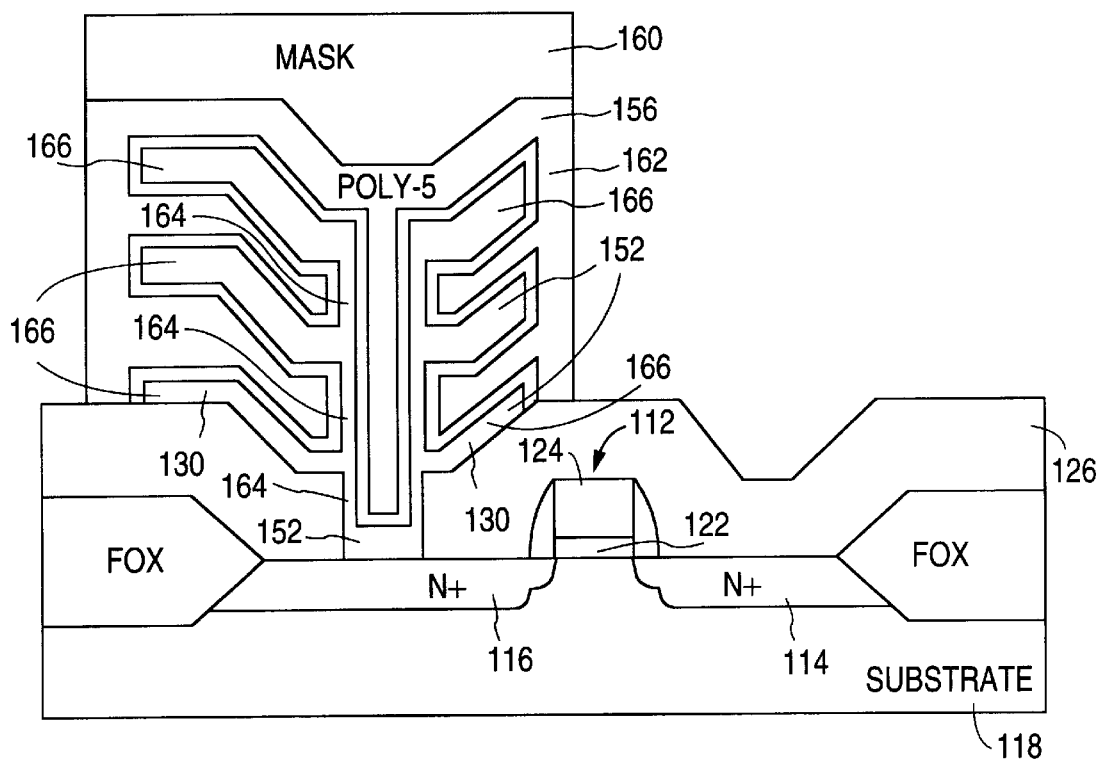

Next, as shown in FIG. 4H, an upper plate mask 160 is formed and patterned over poly-5 layer 156. Following this, the unmasked layer of poly-5 156 is etched to form an upper capacitor plate 162. Conventional back end processing steps are then followed to complete the fabrication of the cell.

Figure 1:
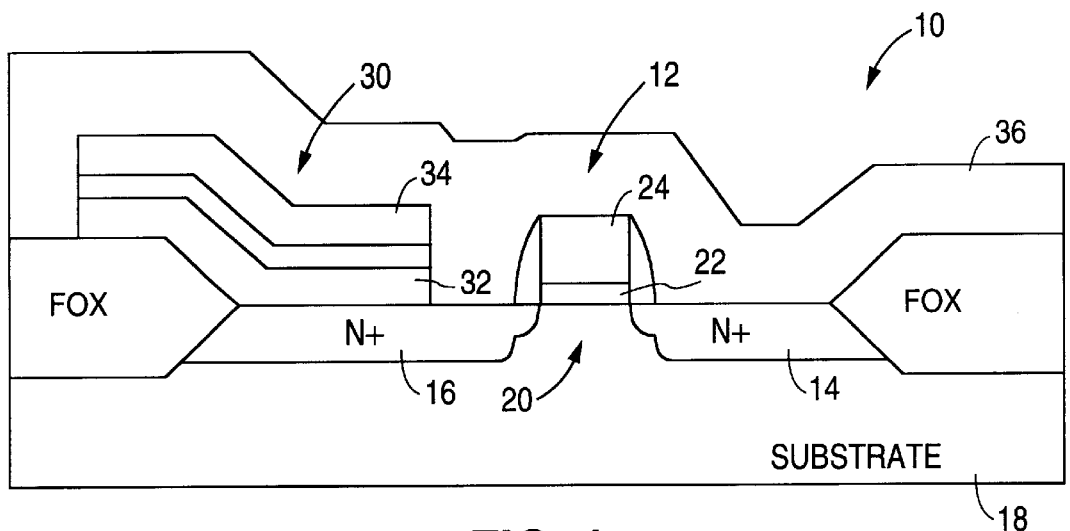
FIG. 1 is a cross-sectional view illustrating a conventional DRAM cell 10.
Figure 2:
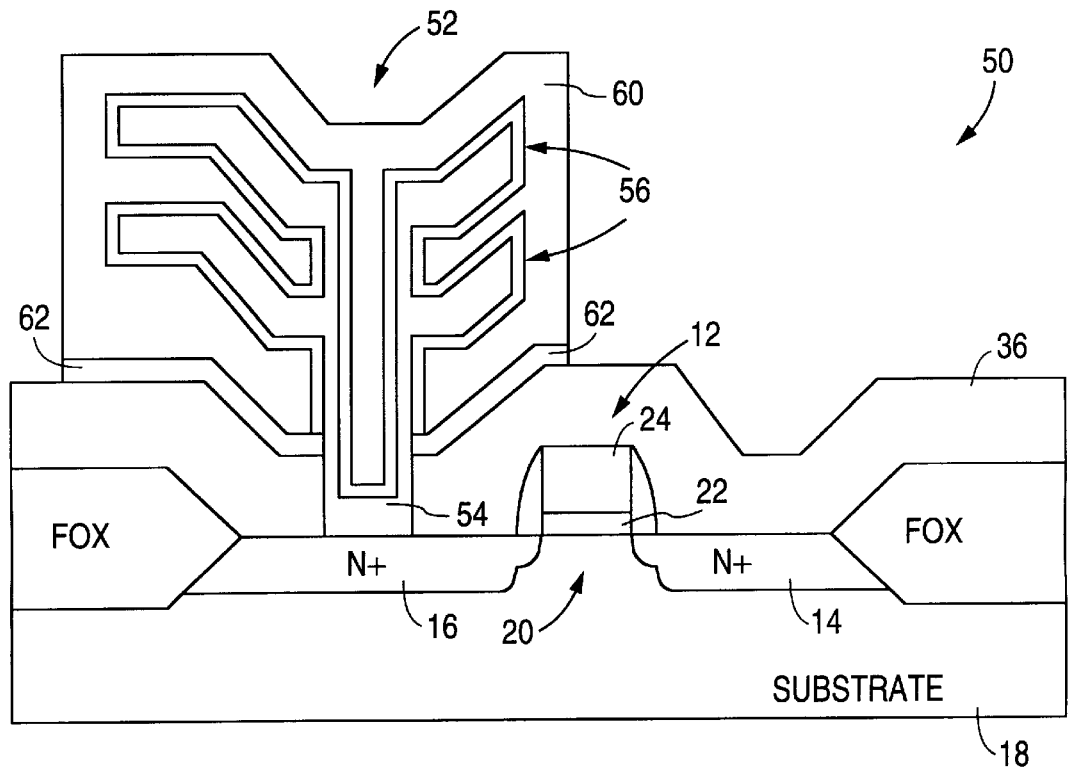
FIG. 2 is a cross-sectional view illustrating a conventional stacked-capacitor DRAM cell 50.
Figure 3A:
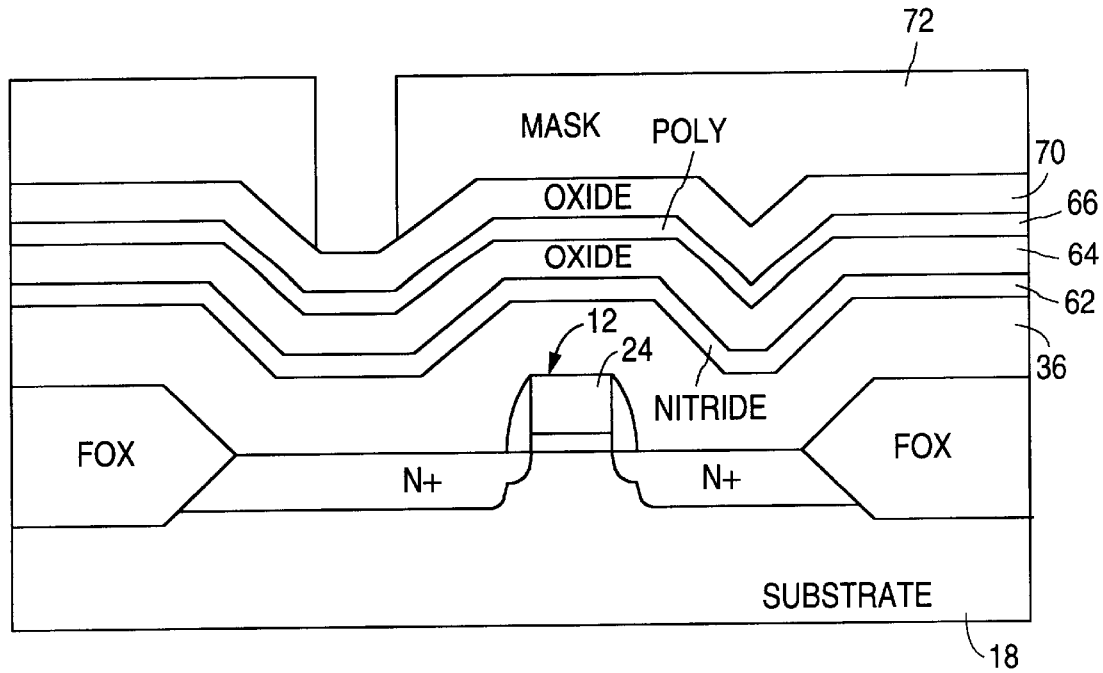
FIGS. 3A–3H are cross-sectional views illustrating the fabrication of DRAM cell 50.
Figure 3B:
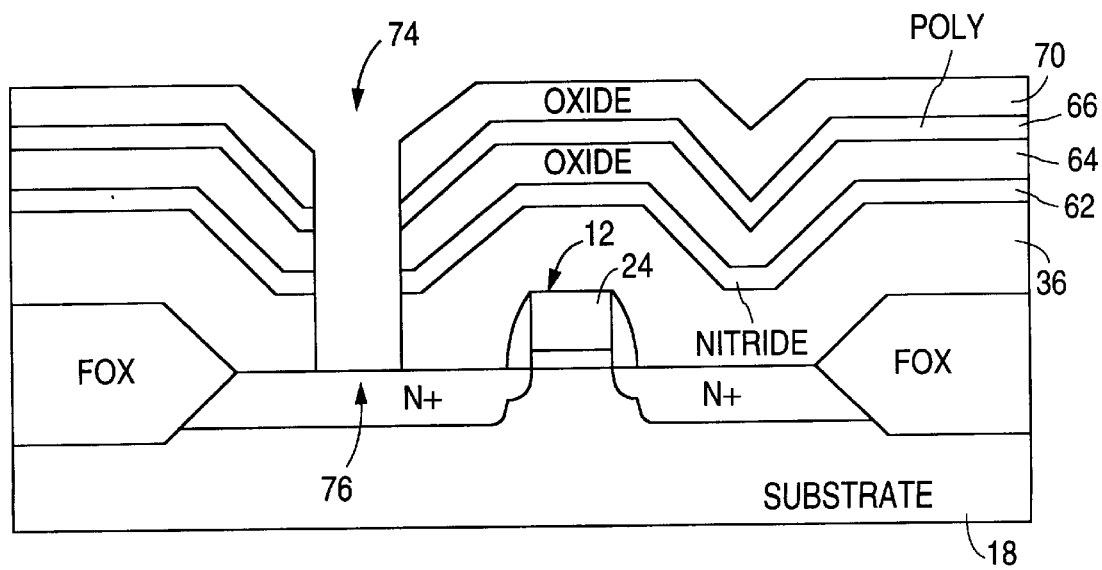
Figure 3C:
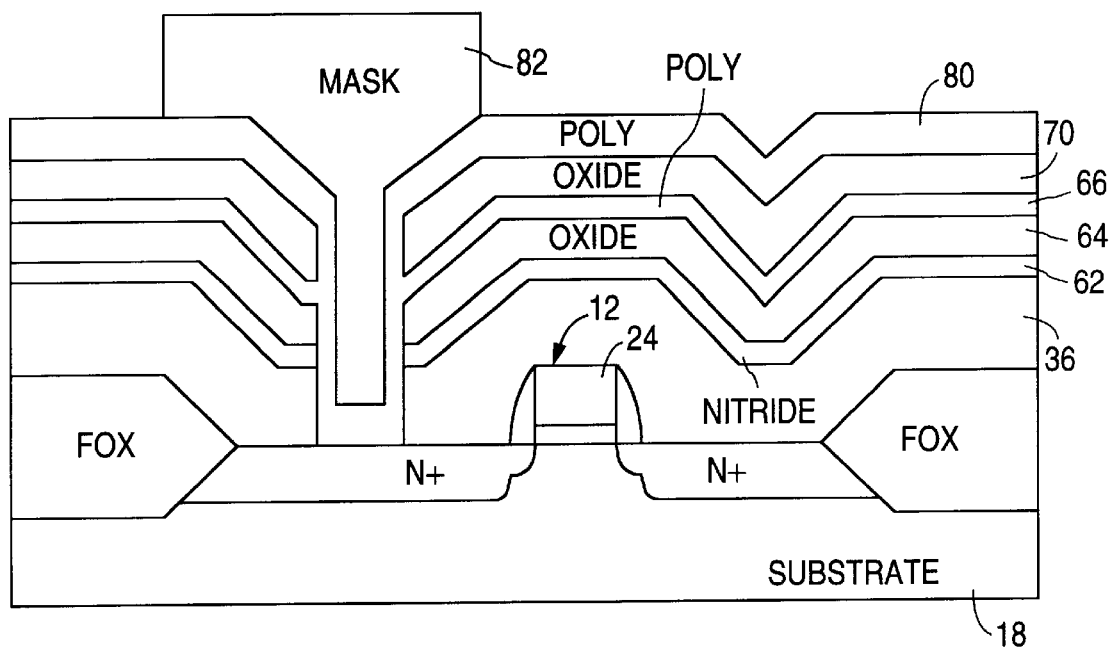
Figure 3D:
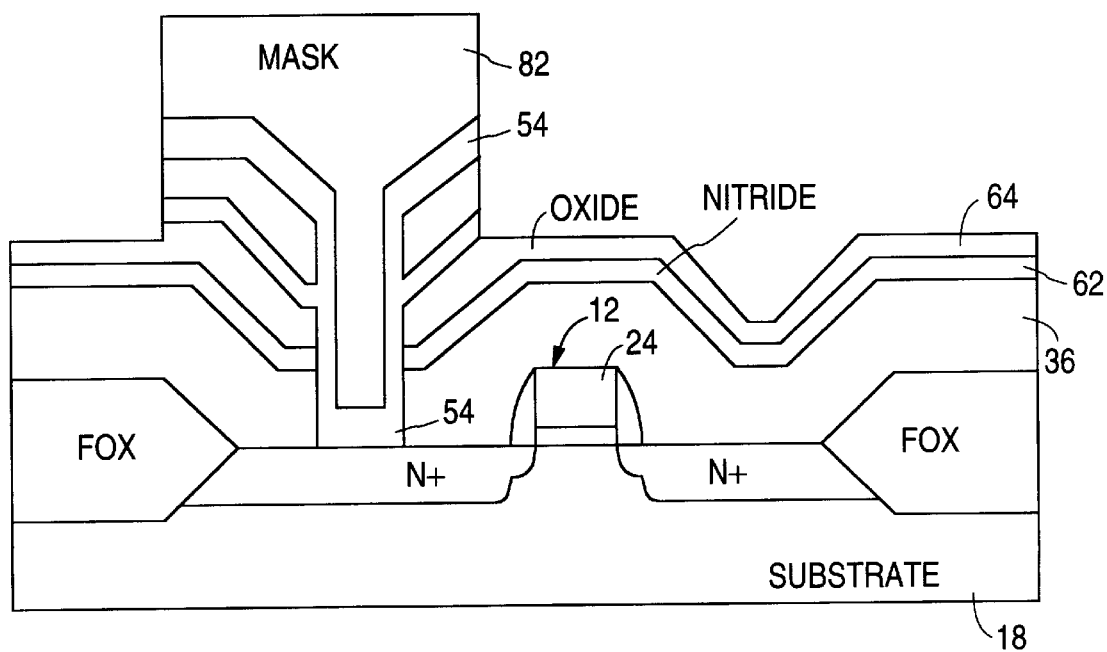
Figure 3E:
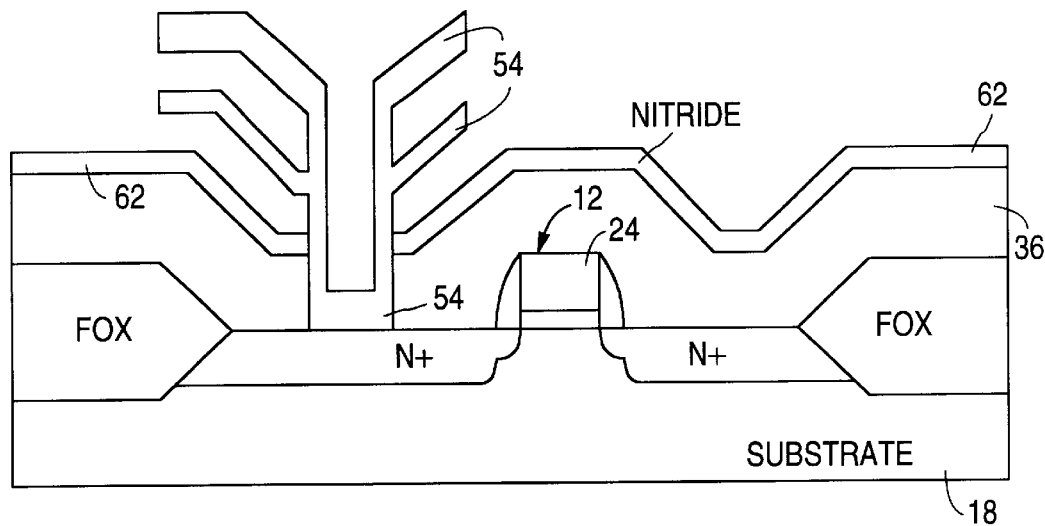
Figure 3F:
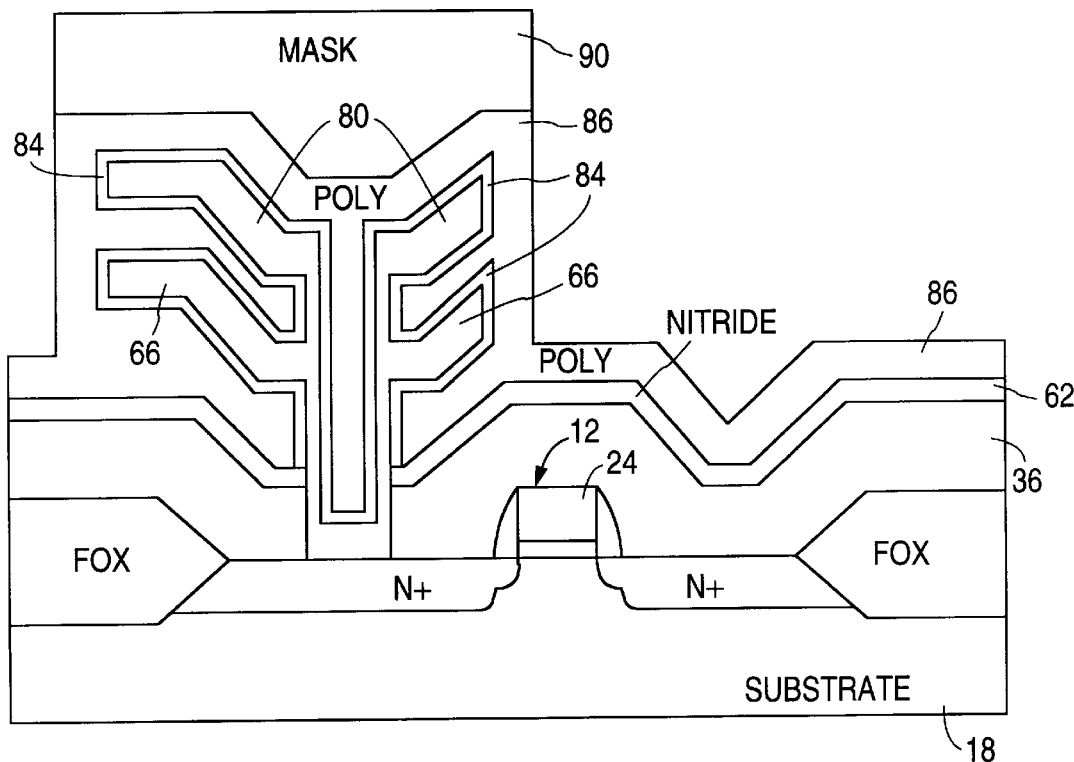
Figure 3G:
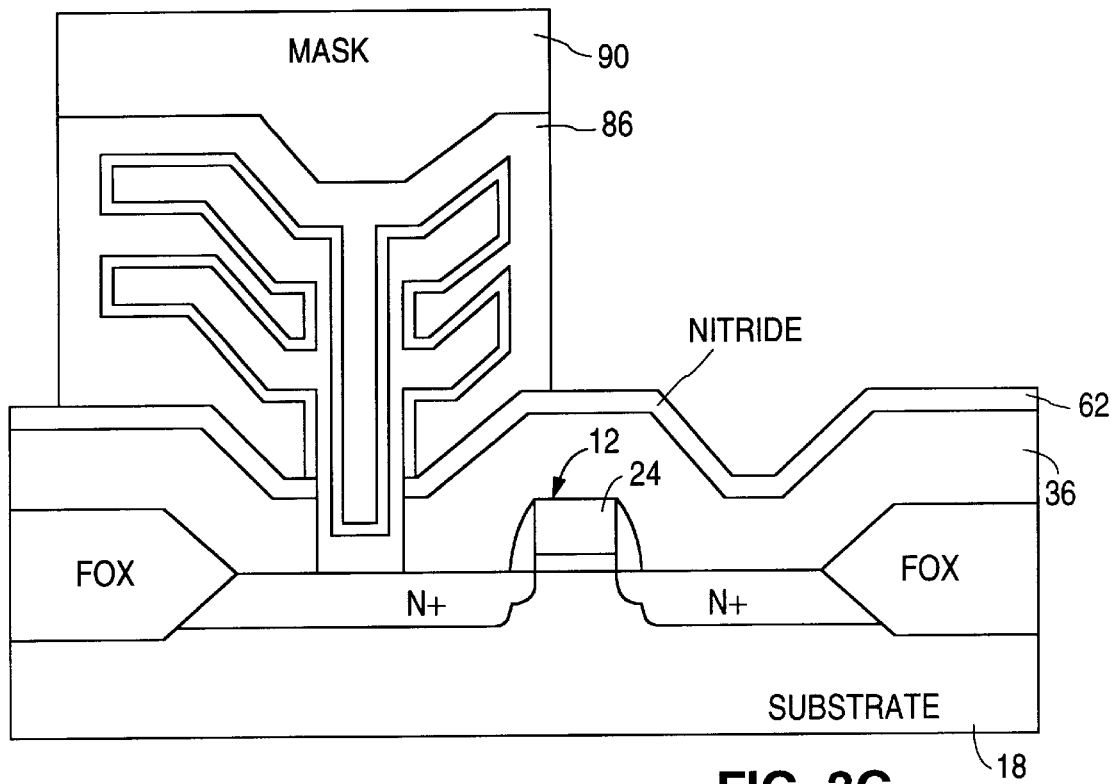
Figure 3H:
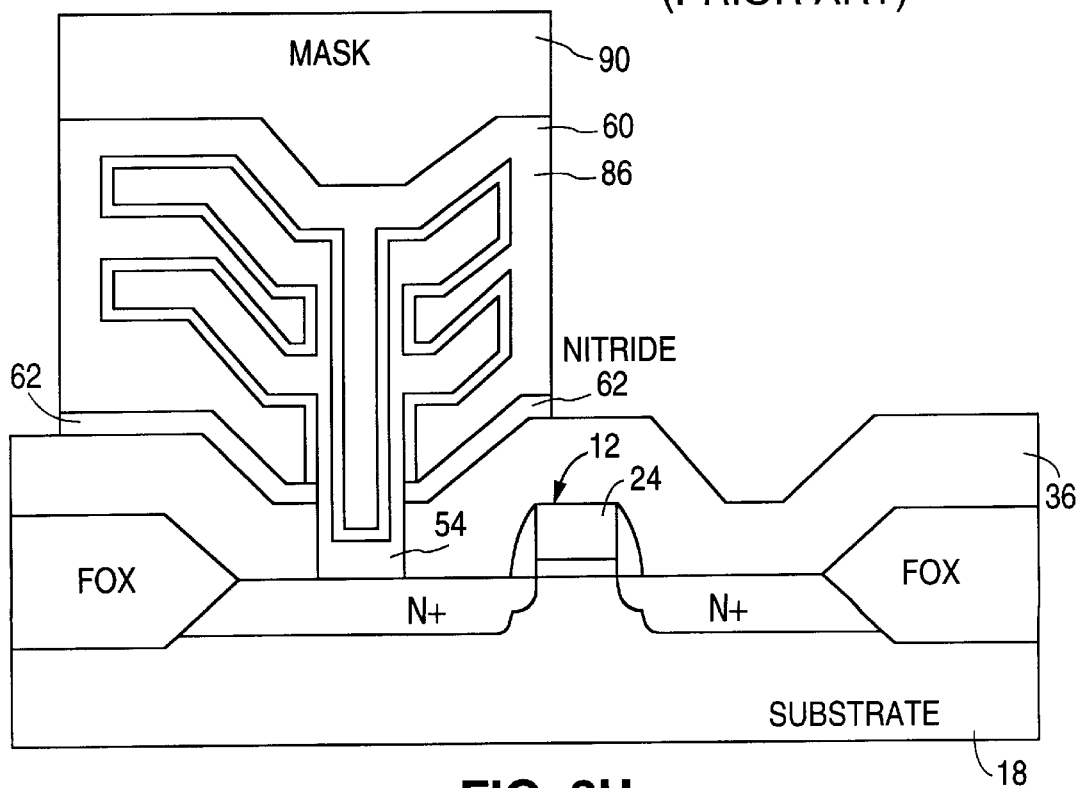

Thus, as shown in FIG. 4H, lower capacitor plate 152 has a vertical section 164 that contacts the drain region 116, and a plurality of wings 166 that extend away from vertical section 164. In accordance with the present invention, as further shown in FIG. 4H, a bottom wing 166 contacts the layer of insulation material 126 which, as shown in FIGS. 3G and 3H, is not the case in the prior art.

One of the advantages of the present invention is that by utilizing poly-2 layer 130 in lieu of a layer of nitride to form an etch stop, hydrogen is neither introduced nor trapped in insulation layer 126.

As a result, the present invention prevents hydrogen from migrating down and enhancing the diffusion of boron from the gates to the underlying layer of gate oxide which, as noted above, undesirably alters the threshold voltages of the PMOS transistors.

Another advantage of the present invention is that by utilizing poly-2 layer 130 in lieu of a layer of nitride, the size, and therefore the capacitance, of the resulting capacitor is increased (going from two wings to two and a half) without increasing the step height of the capacitor.

Alternately, approximately the same capacitance can be achieved with a substantially reduced step height by eliminating poly-3 layer 134 and sacrificial oxide layer 136. In this case, mask 140 would simply be formed on oxide layer 132.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A method for forming a dynamic random-access-memory (DRAM) cell with a stacked capacitor in a substrate of a first conductivity type, the cell including:
   an access transistor having:
      spaced-apart source and drain regions of a second conductivity type formed in the substrate,
      a channel region defined in the substrate between the source and drain regions,
      a layer of gate oxide formed above the channel region, and
      a gate formed on the layer of gate oxide from a first layer of polysilicon (poly-1); and
   a layer of insulation material formed to contact the gate and the source and drain regions, the layer of insulation material being free of a layer of silicon nitride;
   the method comprising the steps of:
   forming a second layer of polysilicon (poly-2) on the layer of insulation material to contact the layer of insulation material;
   forming a first layer of sacrificial material on the layer of poly-2;
   forming a third layer of polysilicon (poly-3) on the first layer of sacrificial material;
   forming a second layer of sacrificial material on the layer of poly-3;
   selectively etching the second layer of sacrificial material, the layer of poly-3, the first layer of sacrificial material, the layer of poly-2, and the layer of insulation material to form a contact opening that exposes a contact area on the surface of the drain region, the contact opening having sidewalls; and
   forming a fourth layer of polysilicon (poly-4) on the second layer of sacrificial material, the sidewalls of the contact opening, and the contact area.

2. The method of claim 1 and further comprising the steps of:
   selectively etching the layer of poly-4, the second layer of sacrificial material, the layer of poly-3, and a portion of the first layer of sacrificial material to partially define a lower capacitor plate;
   etching to remove substantially all of the first and second layers of sacrificial material; and
   selectively etching the layer of poly-2 to completely define the lower capacitor plate.

3. The method of claim 2 wherein the etching step that removes substantially all of the first and second layers of sacrificial material is isotropic.

4. The method of claim 2 wherein the selective etching step that etches the layer of poly-4 includes the steps of:
   forming a mask on the surface of the layer of poly-4 to define a masked area and an unmasked area;
   etching the layer of poly-4, the second layer of sacrificial material, the layer of poly-3, and a portion of the first layer of sacrificial material; and
   removing the mask prior to the etching step that removes substantially all of the first and second layers of sacrificial material.

5. The method of claim 1 and further comprising the steps of:
   forming a layer of dielectric on the layer of poly-2, the layer of poly-3, and the layer of poly-4;
   forming a fifth layer of polysilicon (poly-5) on the layer of insulation material and the layer of dielectric;
   selectively etching the layer of poly-5 to define an upper capacitor plate.

6. The method of claim 1 wherein the first and second layers of sacrificial material are an oxide.

7. The method of claim 1 wherein the layers of poly-2, poly-3, and poly-4 are doped to have the second conductivity type.

8. The method of claim 1 wherein the selective etch step includes the steps of:
   forming a mask having a mask opening that exposes a mask area on the surface of the second layer of sacrificial material;
   etching the second layer of sacrificial material, the layer of poly-3, the first layer of sacrificial material, the layer of poly-2, and the layer of insulation material, the contact area and the mask area being substantially equal; and
   removing the mask.

9. A method for forming a dynamic random-access-memory (DRAM) cell with a stacked capacitor in a substrate of a first conductivity type, the cell including:
   an access transistor having:
      spaced-apart source and drain regions of a second conductivity type formed in the substrate,
      a channel region defined in the substrate between the source and drain regions,
      a layer of gate oxide formed above the channel region, and
      a gate formed on the layer of gate oxide from a first layer of polysilicon (poly-1); and
   a layer of insulation material formed to contact the gate and the source and drain regions, the layer of insulation material being free of a layer of silicon nitride;
   the method comprising the steps of:
   forming a second layer of polysilicon (poly-2) on the layer of insulation material to contact the layer of insulation material;
   forming a layer of sacrificial material on the layer of poly-2;
   selectively etching the second layer of sacrificial material, the layer of poly-2, and the layer of insulation material to form a contact opening that exposes a contact area on the surface of the drain region, the contact opening having sidewalls; and
   forming a third layer of polysilicon (poly-3) on the layer of sacrificial material, the sidewalls of the contact opening, and the contact area.

10. The method of claim 9 and further comprising the steps of:
    selectively etching the layer of poly-3, and a portion of the first layer of sacrificial material to partially define a lower capacitor plate;
    etching to remove substantially all of the layer of sacrificial material; and
    selectively etching the layer of poly-2 to completely define the lower capacitor plate.

11. The method of claim 10 wherein the etching step that removes substantially all of the layer of sacrificial material is isotropic.

12. The method of claim 10 wherein the selective etching step that etches the layer of poly-3 includes the steps of:
    forming a mask on the surface of the layer of poly-3 to define a masked area and an unmasked area;
    etching the layer of poly-3 and a portion of the layer of sacrificial material; and
    removing the mask prior to the etching step that removes substantially all of the layer of sacrificial material.

13. The method of claim 9 and further comprising the steps of:
    forming a layer of dielectric on the layer of poly-2 and the layer of poly-3;
    forming a fourth layer of polysilicon (poly-4) on the layer of insulation material and the layer of dielectric;
    selectively etching the layer of poly-4 to define an upper capacitor plate.

14. The method of claim 9 wherein the first layer of sacrificial material is an oxide.

15. The method of claim 9 wherein the layers of poly-2 and poly-3 are doped to have the second conductivity type.

16. The method of claim 9 wherein the selective etch step includes the steps of:
    forming a mask having a mask opening that exposes a mask area on the surface of the layer of sacrificial material;
    etching the layer of sacrificial material, the layer of poly-2, and the layer of insulation material, the contact area and the mask area being substantially equal; and
    removing the mask.

* * * * *